United States Patent [19]

Taylor

[11] Patent Number: 4,981,770
[45] Date of Patent: Jan. 1, 1991

[54] PROCESS FOR FABRICATION OF DEVICE

[75] Inventor: Gary N. Taylor, Bridgewater, N.J.

[73] Assignee: AT&T Bell Laboratories, Murray Hill, N.J.

[21] Appl. No.: 387,554

[22] Filed: Jul. 28, 1989

[51] Int. Cl.$^5$ .......................... G03F 7/075; G03F 7/32
[52] U.S. Cl. .................................... 430/313; 430/317; 430/326; 430/967; 430/325
[58] Field of Search ............... 430/313, 317, 325, 326, 430/967

[56] References Cited

U.S. PATENT DOCUMENTS 4,500,628 2/1985 Taylor ................................. 430/311
4,596,761 6/1986 Brault ................................. 430/296
4,810,601 3/1989 Allen et al. ........................... 430/18

OTHER PUBLICATIONS

Follett et al. "Polarity Reversal of PMMA by Treatment with Chlorosilanes", Extend Abstracts, 1046B, vol. 82-2, Oct. 1982.

G. N. Taylor et al., Journal of the Electrochemical Society, 131, 1659 (1984).
Semiconductor Lithography, W. Moreau, Plenum Press, New York, 1988 (Because of the Length of the Article, Only the Table of Contents are Provided).

Primary Examiner—Jose Dees
Attorney, Agent, or Firm—Bruce S. Schneider

[57] ABSTRACT

The use of a surface treatment approach to lithography, depending on a radiation-induced change in hydrophilicity, shows particular promise for deep UV, vacuum ultraviolet and x-ray lithography. For example, hydrophobic chlorinated polystyrene is selectively irradiated in the presence of oxygen producing local hydrophilic regions. Subsequent treatment of these hydrophilic regions with water followed by an organometallic or inorganic gas such as $TiCl_4$ yields a patterned, surface metal oxide suitable as, for example, an etch mask for further patterning of the underlying polymer film and device regions.

14 Claims, 1 Drawing Sheet

POLYMER SUBSTRATE

POLYMER SUBSTRATE (1) EXPOSURE (1) EXPOSURE (2) $H_2O$ TREATMENT (2) $H_2O$ TREATMENT

PROCESS FOR FABRICATION OF DEVICE

BACKGROUND OF THE INVENTION

1. Field of the Invention

This invention relates to lithography and, in particular, to lithography in device fabrication.

2. Art Background

Increased miniaturization has been a consistent objective in device manufacture. This objective is commonly expressed in terms of devices with stricter and stricter design rules. (The design rule defines the smallest dimension of a critical structure utilized in the device.) In the production of such devices such as semiconductor devices, selective patterning on the device substrate of structures with design rule dimensions is required. Such selective patterning is accomplished by forming a radiation-sensitive region on the substrate, exposing this region through its thickness to patterned radiation, and then selectively removing either the exposed or unexposed regions (typically through differential solubility) to produce the desired pattern.

As design rules become stricter, exposing radiation of shorter wavelength is required. For example, it is generally believed that deep UV exposing radiation (200 to 250 nm) will be required for design rules stricter than 0.5 $\mu$m while vacuum ultraviolet (100 to 200 nm) or X-ray (0.5 to 100 nm) exposing radiation will be necessary for 0.3 $\mu$m or finer design rules. However, with conventional approaches to lithography the use of shorter wavelength radiation presents additional difficulties. For example, typically a radiation sensitive material is exposed through its thickness. The image incident on the radiation sensitive material is in focus to a depth that strongly depends on the wavelength of the exposing radiation. For device structures involving 0.3 $\mu$m lines and spaces, and radiation of wavelength 248 nm or shorter, the depth-of-focus is no greater than 1 $\mu$m, but a radiation sensitive material generally of at least 1.2 $\mu$m thickness is required to prevent total removal during pattern transfer. Therefore, at shorter wavelengths, where exposure through the thickness of the radiation sensitive material followed by differential dissolution is employed, some loss of resolution occurs.

A surface reaction approach to lithography significantly reduces resolution loss due to depth-of-focus. As described in an article by G. N. Taylor, et al. *Journal of the Electrochemical Society*, 131, 1659 (1984), a substrate such as silicon coated with a radiation sensitive organic film is selectively exposed to produce a pattern due to chemical change. The surface is then subjected to reagents that through chemical surface interaction produces formation of a mask material on the substrate in a pattern consistent with the initial exposure. (The substrate includes the device layers being processed and, if present, the radiation sensitive material.) The mask material is then utilized for selectively treating the underlying substrate in processes such as etching, lift-off or electroplating. Since only the change in surface chemistry is employed to produce the mask, depth-of-focus problems are significantly reduced.

Although these surface treatment procedures hold significant promise, they have not been extensively investigated. Chemistries suitable for exposures that must be done in a vacuum environment such as exposure to vacuum ultraviolet and x-rays have not been disclosed. Thus, a further elucidation of suitable chemistries for surface treatment lithography is desirable.

SUMMARY OF THE INVENTION

In a surface treatment lithographic approach, a chemistry that induces a change in the hydrophilicity of the radiation sensitive material yields excellent results for deep ultraviolet exposure and allows exposure in the vacuum ultraviolet and x-ray regions from 10–100 nm where absorption is extremely high. For example, hydrophobic chlorinated polystyrene is selectively exposed in the presence of oxygen to the desired pattern of deep ultraviolet or vacuum ultraviolet radiation. Oxygen reacts with the chlorinated polystyrene in the irradiated regions producing hydrophilic material. The substrate is then subjected to water vapor which interacts with the hydrophilic regions, and is subsequently treated with a metal-containing composition such as an organometallic or an inorganic material. The metal-containing composition reacts with the water-modified region to produce a metal oxide. The metal oxide is then employed as a suitable mask for processes such as etching or as a template for deposition.

Alternatively, a material such as hydrophilic poly(4-vinylphenylacetic acid) or poly(4-(2-acetoxy-2-propyl)-styrene) is selectively exposed to radiation such as 193 nm, 248 nm or x-ray radiation. The exposed regions due to decomposition become more hydrophobic. Subsequent introduction of water causes interaction with the unexposed regions and treatment with a metal organic or inorganic vapor yields a mask that is positive to the exposing radiation pattern.

Since there is available a variety of organometallic and inorganic materials that react with water and a variety of materials that undergo a radiation-induced hydrophilicity change, the invention allows significant flexibility in the performance of surface lithographic procedures.

BRIEF DESCRIPTION OF THE DRAWING

The figure is illustrative of processes involved in the invention.

DETAILED DESCRIPTION

Figure 1:
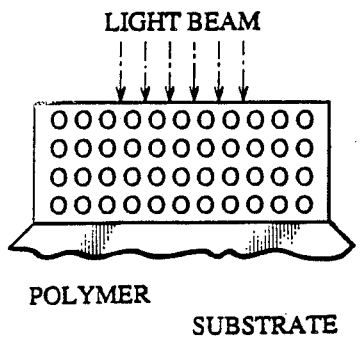
Figure 2:
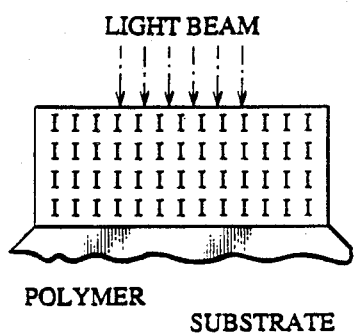
Figure 3:
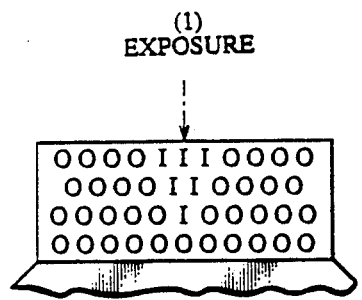
Figure 4:
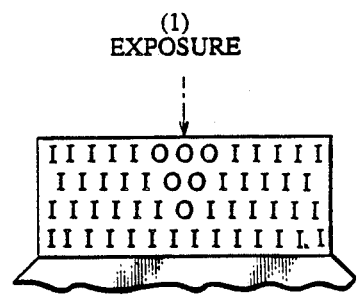
Figure 5:
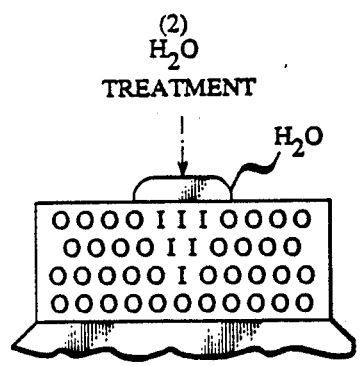
Figure 6:
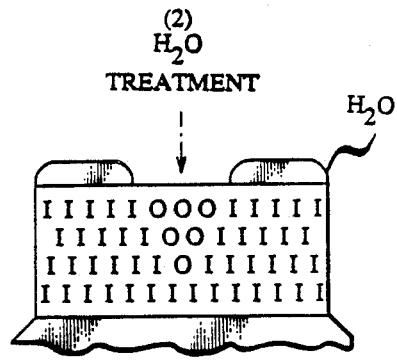
Figure 7:
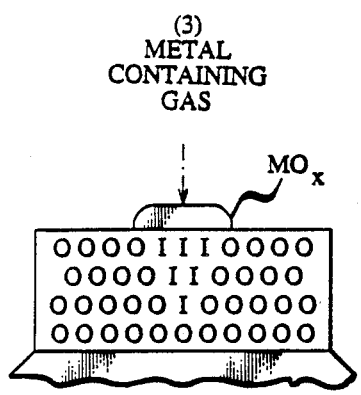
Figure 8:
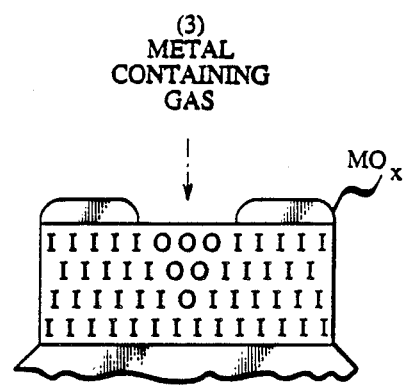
Figure 9:
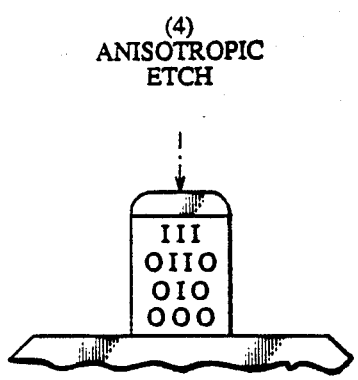
Figure 10:
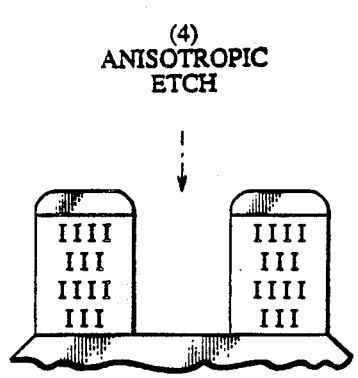

The basic steps in surface treatment lithography are described in U.S. patent application Ser. No. 532,776 filed Sept. 16, 1983, abandoned (Stillwagon 2-14-13-1) which is hereby incorporated by reference. Basically, as previously described, this approach involves selective exposure of a material to radiation and surface treatment of the selectively irradiated material to produce a mask. The mask is used for subsequent device processing. The applicant's invention utilizes a specific radiation-induced change—a change in hydrophilicity—to allow surface treatment with formation of the desired mask.

A variety of materials that undergo a radiation induced change in hydrophobicity are available. Materials having functional groups such as

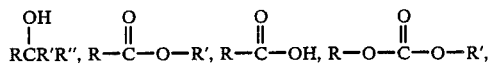

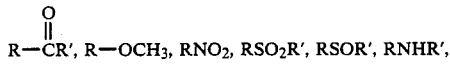

-continued

RCNHR', RCNR'R", and ionic organic groups such as alkyl ammonium halides, (where R, R', and R" are not critical and are groups including aliphatic groups such as lower alkyl, alicyclic groups such as cyclohexyl, and aromatic groups such as phenyl or naphthyl provided these substituents do not contain a hydrophilic moiety) are hydrophilic in the sense of this invention, e.g. are hydrogen bonded to water with a hydrogen bond energy greater than 0.5 Kcal/mole. Thus, for example, a substantial increase in hydrophilicity is obtained when a hydrophobic material represented by "O" in the Figure is chemically reacted to form such functional groups by exposure to radiation. Examples of such reaction involve irradiation induced reaction of oxygen with a variety of radiation sensitive materials such as poly(vinyl aromatic compounds) containing halogen, alkyls such as methyl, and cycloalkyl, and substituted alkyls such as halomethyl dihalomethyl, and trihalomethyl groups where halogen includes chlorine, bromine, fluorine and iodine. Similarly, the local irradiation of materials represented by "I" in the Figure such as poly(4-vinylphenylacetic acid) having such hydrogen bonding and oxygen-containing functional groups to induce a decomposition, e.g. loss of oxygen and $CO_2$, produces a localized increase in hydrophobicity. The invention generically includes the localized change of hydrophilicity and the use of such functional groups is merely illustrative of the wide variety of materials available that undergo the desired change. (In the context of this invention, hydrophobicity is the inverse of hydrophilicity and thus, by implication, a change in hydrophilicity implies an inverse corresponding change in hydrophobicity.)

To induce the formation of suitable functional groups that yield an increase in hydrophilicity, reaction with oxygen is advantageously employed. Typically, a relatively low partial pressure of oxygen in the irradiated region is required. (Reactions requiring the introduction of oxygen are advantageously not employed for x-ray exposure since oxygen strongly absorbs x-rays in the applicable region of 10 to 100 nm). Generally, partial pressures in the range 0.001 to 1.00 atm. are suitably employed. Partial pressures less than 0.001 atm. require longer exposure time to yield significant reaction. Partial pressures greater than $10^{-3}$ atm., although not precluded, are generally undesirable for exposure that must be performed in a vacuum environment, i.e. irradiation with vacuum ultraviolet or x-ray radiation. Typically, exposure doses in the range 1 to 500 $mJ/cm^2$, for partial pressures in the range 1.0 to 0.001 atm., yield suitable changes in hydrophilicity, i.e. changes of at least one mole percent of all non-hydrophilic reactive surface groups.

Similarly, the decomposition of materials (for example, resulting in the liberation of oxygen or hydrogen bonding groups such as $CO_2$, and a concomitant increase in hydrophobicity of the exposed region) typically requires doses in the range 1.0 to 1000 $mJ/cm^2$. Doses less than approximately 1 $mJ/cm^2$ generally produce inadequate changes in hydrophobicity, while doses greater than approximately 1000 $mJ/cm^2$ are undesirable because they lead to low throughput. Generally, where decomposition is being induced to yield the desired change in hydrophilicity, the liberated gases are in such small quantity that they have negligible effect on the vacuum environment required for irradiation with vacuum ultraviolet or x-rays.

After the patterned exposure of the radiation sensitive material, the exposed substrate is subjected to an environment that includes water (step 2 in the Figure) or that produces water upon interaction with the substrate. Generally, water partial pressures at room temperature in the range 10% relative humidity to 70% relative humidity are suitable to induce a significant surface change of the substrate. Functional groups, bound to water by hydrogen bonds, are thus produced in the exposed regions in the case of irradiation induced increase of hydrophilicity, and in the unexposed regions in the case of a radiation-induced decrease in hydrophilicity. Interaction with the water produces a hydrogen bonded multi-layer of water on the hydrophilic regions. Typically, a density of at least 1 atom % for atoms involved in such hydrogen bonding functional groups is desirable for subsequent mask formation provided such atoms have an atomic number greater than 2.

The functionalized substrate is then subjected to a gaseous metal-containing material (step 3 in the Figure) that reacts with water sorbed on the hydrophilic functional groups to yield a non-volatile metal oxide. Gaseous metal-containing materials having aluminum, tungsten and titanium have been found to be advantageously employed. For example, aluminum containing materials such as diethylaluminum chloride, tungsten containing materials such as $WF_6$, and titanium containing materials such as $TiCl_4$ react with the oxygen-containing functional groups of the treated substrate. Corresponding metal oxides such as aluminum oxide, tungsten oxide or titanium oxide are formed.

Generally, metal containing materials are introduced in the gas phase at a partial pressure in the range 0.001 to 1.0 atm. Partial pressures less than $10^{-3}$ atm. typically do not lead to adequate metal oxide formation while partial pressures greater than 1.0 atm. are inconvenient because a high pressure apparatus is required. A metal containing material should be chosen so that the by-products of the reaction of this material with the treated substrate do not produce contamination of the resulting metal oxide or substrate materials. This contamination is generally avoided by ensuring that the by-products of the reaction are gaseous. Additionally, metal containing materials that have an adequate reaction rate to form the metal oxide in an acceptable time period, e.g. a time period less than 60 sec, is desirable. Thus, typically materials such as $SiCl_4$ and dimethylchlorosilane are not acceptable since substantial silicon dioxide formation is not produced. Suitable materials are chosen using a control sample through metal oxide deposition on a standard hydrophilic film such as a novolac based positive photoresist baked at 210° C. for two hours to determine suitable reaction rate. It is also generally desirable to employ a material that has a room temperature vapor pressure of at least 1 mm of Hg. Lower room temperature vapor pressures increase the difficulty of producing adequate partial pressures of the desired metal containing material at the treated substrate surface.

The resulting metal oxide mask in the case of irradiation induced decrease in hydrophilicity is the positive pattern of that used during radiation exposure while a negative pattern is obtained for a radiation induced increase in hydrophilicity. Generally, the production of a positive pattern is more desirable in situations where contact windows are defined. The production of a negative induced pattern is more desirable when isolated line features are defined.

The resulting metal oxide mask is employed for subsequent treatment of the substrate towards completion of the desired device. For example, a metal oxide mask is used during etching of the underlying radiation sensitive material and then for the etching of uncovered regions of the substrate. Metal oxides which are very resistant to etching processes such as $O_2$ reactive ion etching used to remove unmasked resist regions are favored, especially those having etching rates greater than or equal to 100 times slower than those of polystyrene or positive photoresist baked at high temperatures (about 210° C.) for several hours. In this regard, $SiO_2$ is not preferred since it has an etching rate under $O_2$ RIE conditions of 8 to 12 Å per minute vs. about 800 Å per minute for each of the two organic resists mentioned above. $TiO_2$, $WO_3$ and $Al_2O_3$ masks are preferred since they are removed at rates of 0.5, 1.5 and 2.0 Å per minute, respectively, under identical etching conditions. Alternatively, the underlying radiation sensitive material is etched and deposition onto the substrate is performed. Subsequent removal of the radiation sensitive material with its overlying metal oxide mask leaves a selective deposition on the substrate. A variety of processing techniques utilizing masks and suitable fabrication processes for the formation of devices is described in *Semiconductor Lithography*, W. Moreau, Plenum Press, New York 1988.

The following examples are illustrative of conditions employed in the practice of the subject invention.

EXAMPLE 1

Chlorinated polystyrene (CPS) prepared by direct chlorination of polystyrene (photolysis of polystyrene in a chlorine ambient or acid catalyzed reaction of chlorine with polystyrene), containing 1.15 Cl per monomer repeat unit, and having an $\overline{M}_w$ of 170,000 g/mole was spin coated at about 2000 rpm onto a silicon wafer from a 10 wt % solution in chlorobenzene to give a 1 $\mu$m film. The film was prebaked at 120° C. for ½ hour in air and had thicknesses in the 0.8–1.2 $\mu$m range depending on the precise spin speed. The film was exposed with a test pattern on a 248 nm 5X projection stepper to a dose of 275 mJ/cm². Upon equilibration at ambient humidity (20 to 70% relative humidity at room temperature) the exposed film was treated with $TiCl_4$ vapor for 1 min starting at an initial pressure of 200 mTorr and ending at a pressure of 10 Torr. Etching was then performed by $O_2$ reactive ion etching (RIE) for 21 min at 10 mTorr $O_2$, 10 sccm $O_2$, −376 V bias and 0.40 W/cm² which afforded 0.4 and 0.8 $\mu$m line and space patterns in a 1.2 $\mu$m resist thickness with a dose latitude of greater than or equal to 10%.

EXAMPLE 2

Both poly($\alpha$-methyl styrene) purchased from Aldrich Chemical Company and chlorinated poly(styrene) were processed as described in Example 1. Both were spin coated from chlorobenzene solution (10 wt %). Exposure on a Leitz IMS 193 nm 36X exposure apparatus, treatment with $TiCl_4$, and development by $O_2$ RIE as in Example 1 gave full thickness negative tone images at doses of 6 mJ/cm² for a 6 mJ/cm²/pulse fluence and approximately 30 mJ/cm² for a 1 mJ/cm²/pulse fluence. Fine features ranging in size from 0.2–2.0 $\mu$m were imaged using chlorinated polystyrene and a fluence of about 0.1 mJ/cm²/pulse. With a dose of about 20 mJ/cm² and processing identical to that described above a minimum feature (isolated line) of about 0.2 $\mu$m in width was resolved in 0.8 $\mu$m thick resist.

EXAMPLE 3

Films having a 1.7 $\mu$m thickness of poly(vinyl benzyltrimethylammonium chloride) were prepared by spin coating with 15 wt % solutions in water-propanol mixed solvent. After baking at 150° C. for 30 min in air the films were exposed with a $Ga^+$ ion beam at 20 KeV in $10^{-9}$ Torr vacuum. Then the film was treated with $TiCl_4$ as described in Example 1 and etched by $O_2$ RIE for 20 min. The etching rate of unexposed regions was essentially zero while that for exposed regions was about 400 Å/min with doses greater than or equal to $10^{16}$ ions/cm². Positive tone patterns were formed in this manner with isolated gaps as small as 0.5 $\mu$m being resolved.

EXAMPLE 4

The procedure of Example 1 was employed except two organic films, a thick bottommost planarizing layer and a thinner topmost imaging layer were used. A 10 weight % solution of poly(chloromethylstryene) was spin coated on a silicon wafer at 1000 rpm and baked at 150° C. for 5 minutes to give a 1.2 micrometer thick film. The film was irradiated with 1 J/cm² of 260 nm light and baked as above to crosslink and harden the film. Then a 0.4 micrometer thick imaging layer of CPS was deposited on the hardened film by spin coating and baking as in Example 1. The organic bilayer film was exposed with a test pattern to 250 mJ/cm² of 248 nm light using a 0.38 NA 5X stepper. Equilibration at ambient humidity, treatment with $TiCl_4$ vapor for one minute as in Example 1, and $O_2$ RIE for 23 minutes gave 0.4 micrometer line and space negative tone patterns in a 1.4 micrometer thick bilayer organic film.

I claim:

1. A process for making a device comprising the steps of forming a region of radiation sensitive material on a substrate, exposing said radiation sensitive material to electromagnetic radiation in a pattern, processing said exposed material to form a patterned mask and employing said mask towards the completion of said device CHARACTERIZED IN THAT said radiation sensitive material undergoes a change of hydrophilicity at least at the surface of said radiation sensitive material upon said exposure, and said processing of said exposed material comprises subjecting said exposed material to water to induce an interaction between said patterned material and said water forming a bonded water entity, and reacting a metal-containing composition with said water entity to form said mask as a metal containing material on said substrate.

2. The process of claim 1 wherein said electromagnetic radiation comprises deep ultraviolet radiation.

3. The process of claim 1 wherein said electromagnetic radiation comprises vacuum ultraviolet radiation.

4. The process of claim 1 wherein said electromagnetic radiation comprises x-rays.

5. The process of claim 1 wherein said radiation sensitive material is hydrophobic.

6. The process of claim 1 wherein said radiation sensitive material after said exposure includes a functionality chosen from the group of

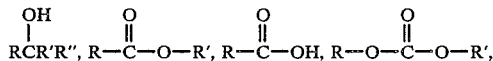

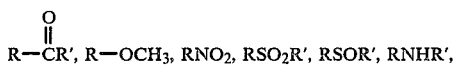

and ionic organic moieties where R, R' and R" are organic moieties that are not hydrophilic.

7. The process of claim 6 wherein said metal containing composition comprises an organometallic.

8. The process of claim 7 wherein said organometallic includes aluminum.

9. The process of claim 6 wherein said metal containing composition comprises an inorganic composition.

10. The process of claim 9 wherein said composition includes tungsten and titanium.

11. The process of claim 1 wherein said radiation sensitive material is hydrophobic.

12. The process of claim 1 wherein said mask comprises an etch mask.

13. The process of claim 1 wherein said employment of said mask includes the step of transferring said pattern into said radiation sensitive material underlying said mask.

14. The process of claim 1 wherein said radiation sensitive material comprises a poly(vinyl aromatic compound) containing a functionality chosen from the group consisting of halogens, alkyls, and halogen substituted alkyls.

* * * * *